US010242993B2

(12) United States Patent
Ichinose

(10) Patent No.: US 10,242,993 B2
(45) Date of Patent: Mar. 26, 2019

(54) SEMICONDUCTOR DEVICE AND METHOD FOR MANUFACTURING SAME

(71) Applicant: Toshiba Memory Corporation, Minato-ku (JP)

(72) Inventor: Daigo Ichinose, Nagoya (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/700,402

(22) Filed: Sep. 11, 2017

(65) Prior Publication Data

US 2018/0090507 A1 Mar. 29, 2018

(30) Foreign Application Priority Data

Sep. 23, 2016 (JP) .................................. 2016-186180

(51) Int. Cl.
| | |
|---|---|
| H01L 27/1157 | (2017.01) |
| H01L 27/11556 | (2017.01) |
| H01L 27/11565 | (2017.01) |
| H01L 27/11575 | (2017.01) |
| H01L 27/11582 | (2017.01) |

(52) U.S. Cl.
CPC .... *H01L 27/11556* (2013.01); *H01L 27/1157* (2013.01); *H01L 27/11565* (2013.01); *H01L 27/11575* (2013.01); *H01L 27/11582* (2013.01)

(58) Field of Classification Search
None
See application file for complete search history.

(56) References Cited

U.S. PATENT DOCUMENTS

| | | |
|---|---|---|
| 2010/0213526 A1 | 8/2010 | Wada et al. |
| 2011/0309431 A1 | 12/2011 | Kidoh et al. |
| 2012/0168858 A1 | 7/2012 | Hong |
| 2012/0299082 A1 | 11/2012 | Park |
| 2017/0263618 A1* | 9/2017 | Shimojo ........... H01L 27/11519 |

FOREIGN PATENT DOCUMENTS

| | | |
|---|---|---|
| JP | 2010-199311 | 9/2010 |
| JP | 2012-4470 | 1/2012 |

* cited by examiner

*Primary Examiner* — Thien F Tran
(74) *Attorney, Agent, or Firm* — Oblon, McClelland, Maier & Neustadt, L.L.P.

(57) ABSTRACT

A semiconductor device includes a stacked body and an insulating portion. The stacked body includes first to fourth electrode layers. The first electrode layer extends along a first direction. The second electrode layer is arranged with the first electrode layer in a second direction. The third electrode layer is provided between the first electrode layer and a word line. The fourth electrode layer is provided between the second electrode layer and the word line. The insulating portion includes first and second portions. The first portion extends along the first direction between the first electrode layer and the second electrode layer and between a portion of the third electrode layer and a portion of the fourth electrode layer. The second portion extends in the third direction between the third electrode layer and the fourth electrode layer, and through the word line.

16 Claims, 17 Drawing Sheets

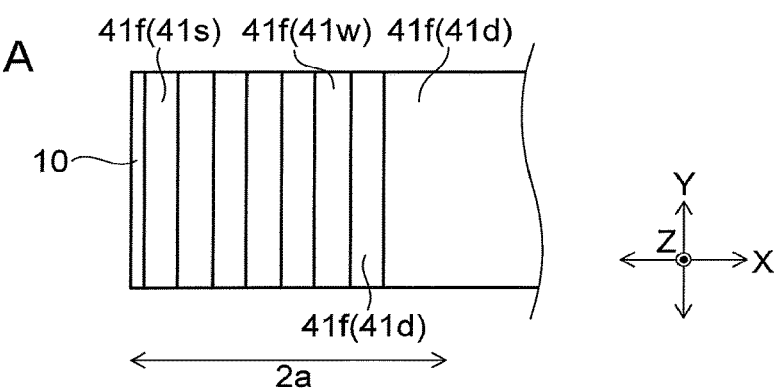
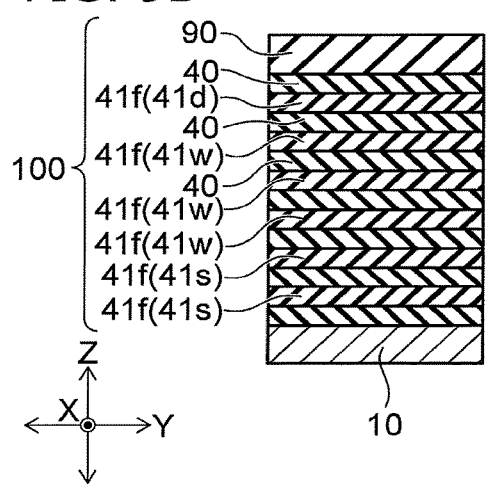
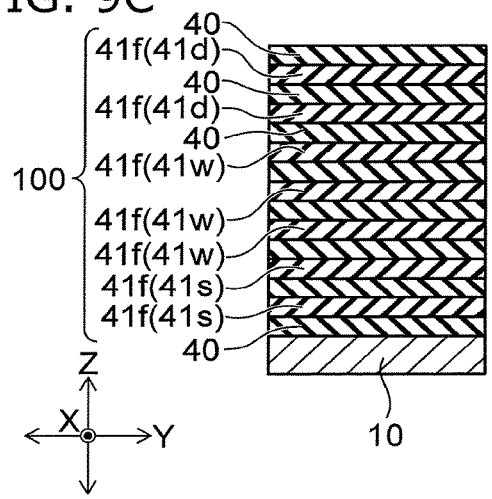
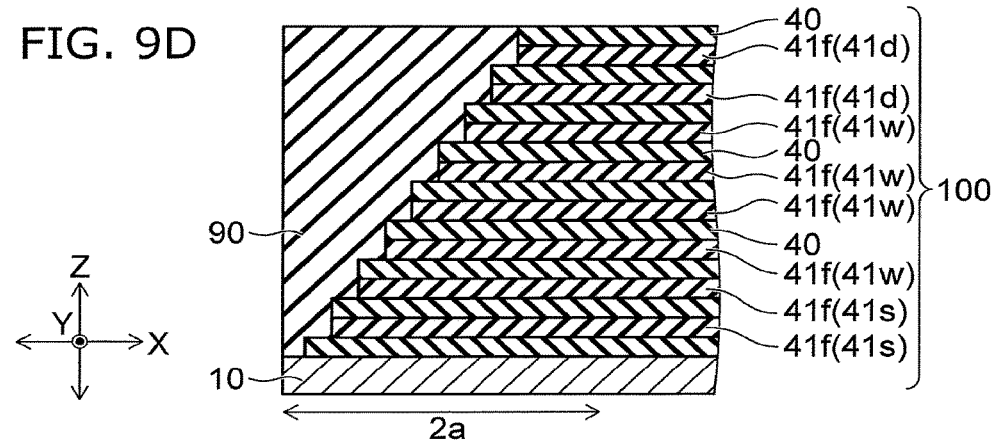

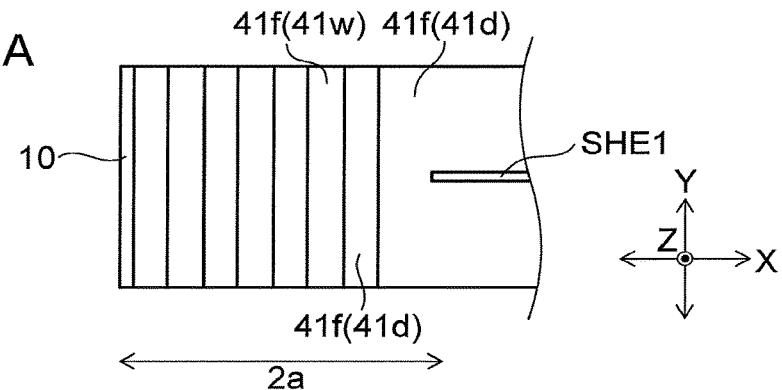
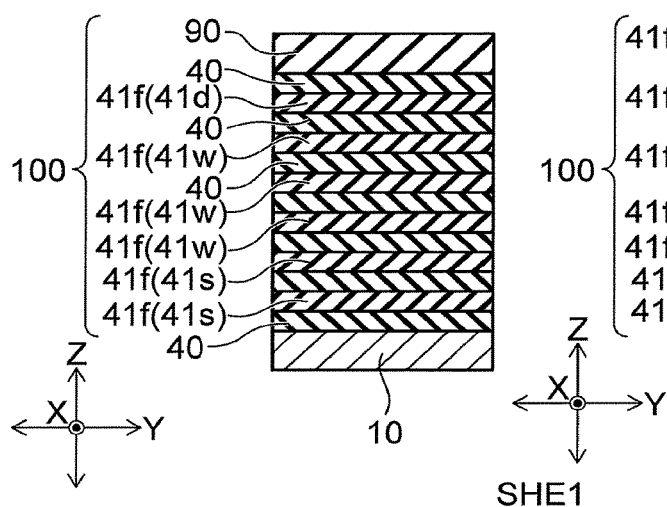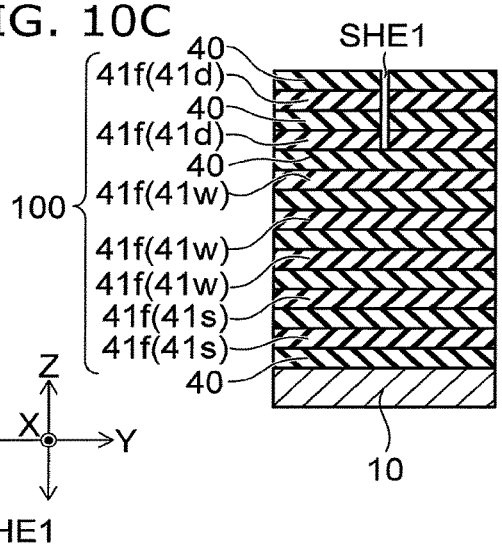
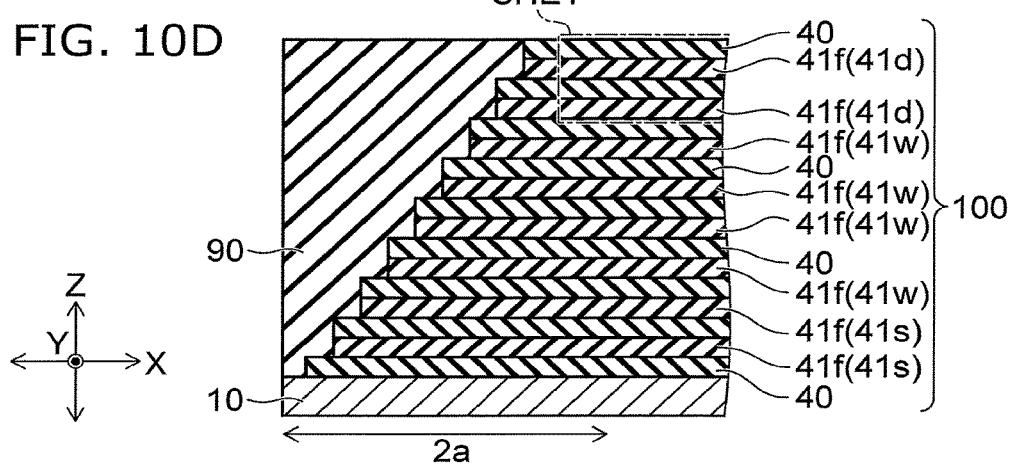

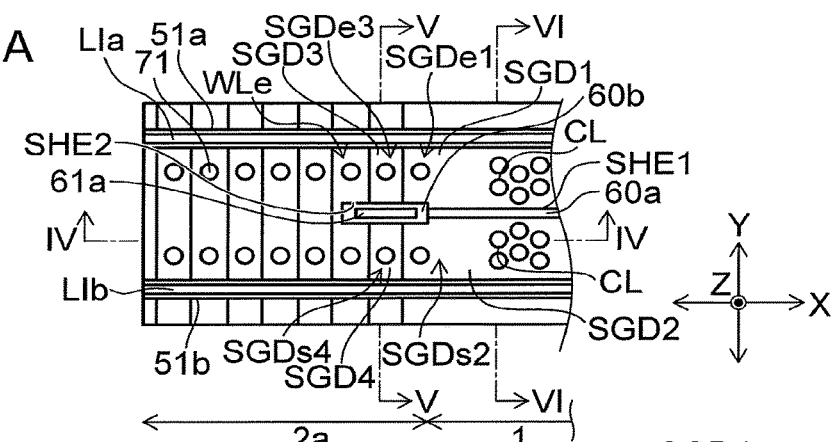
FIG. 16A
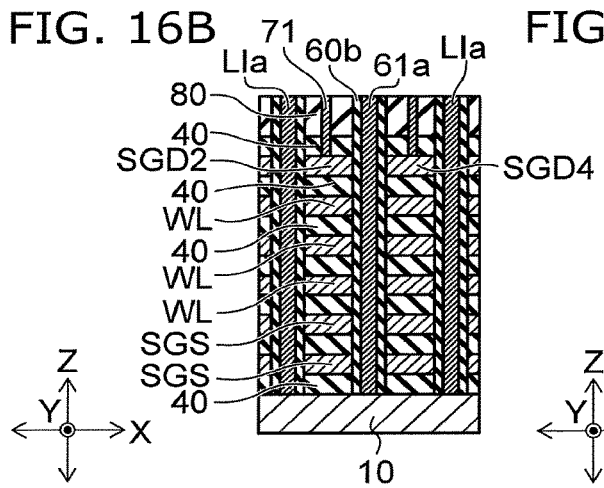
FIG. 16B
FIG. 16C
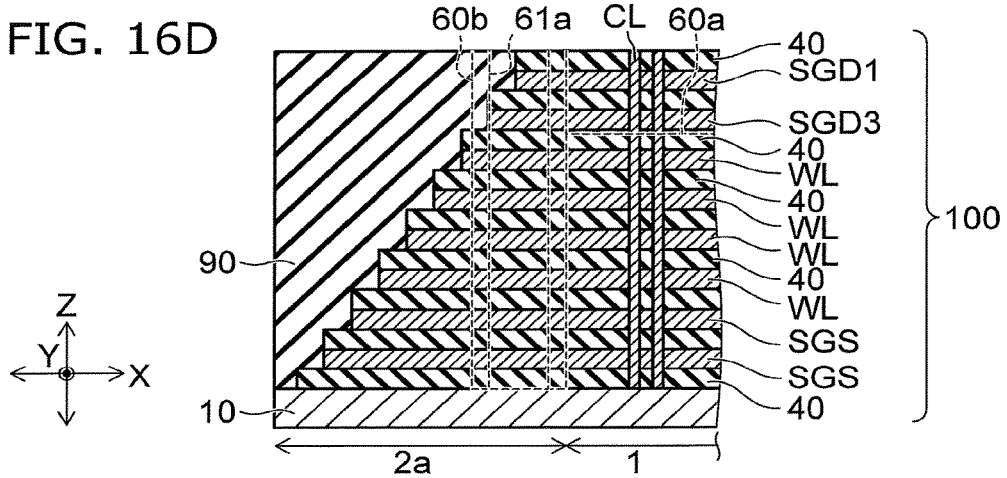
FIG. 16D

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2016-186180, filed on Sep. 23, 2016; the entire contents of which are incorporated herein by reference.

FIELD

Embodiments relate to a semiconductor device and a method for manufacturing the same.

BACKGROUND

A semiconductor memory device that has a three-dimensional structure has been proposed in which a memory hole is formed in a stacked body in which multiple electrode layers are stacked, and a charge storage film and a semiconductor film are provided to extend in the stacking direction of the stacked body inside the memory hole. The semiconductor memory device includes multiple memory cells (MC) connected in series between a drain-side selection transistor (STD) and a source-side selection transistor (STS). Multiple slits that divide the stacked body are formed in the stacked body. The region between two slits is called a "block." A configuration has been proposed in which two SGDs are arranged in parallel inside one "block."

BRIEF DESCRIPTION OF THE DRAWINGS

FIGS. 8A to 16D are schematic views showing the method for manufacturing the semiconductor device of the first embodiment;

DETAILED DESCRIPTION

Figure 1:
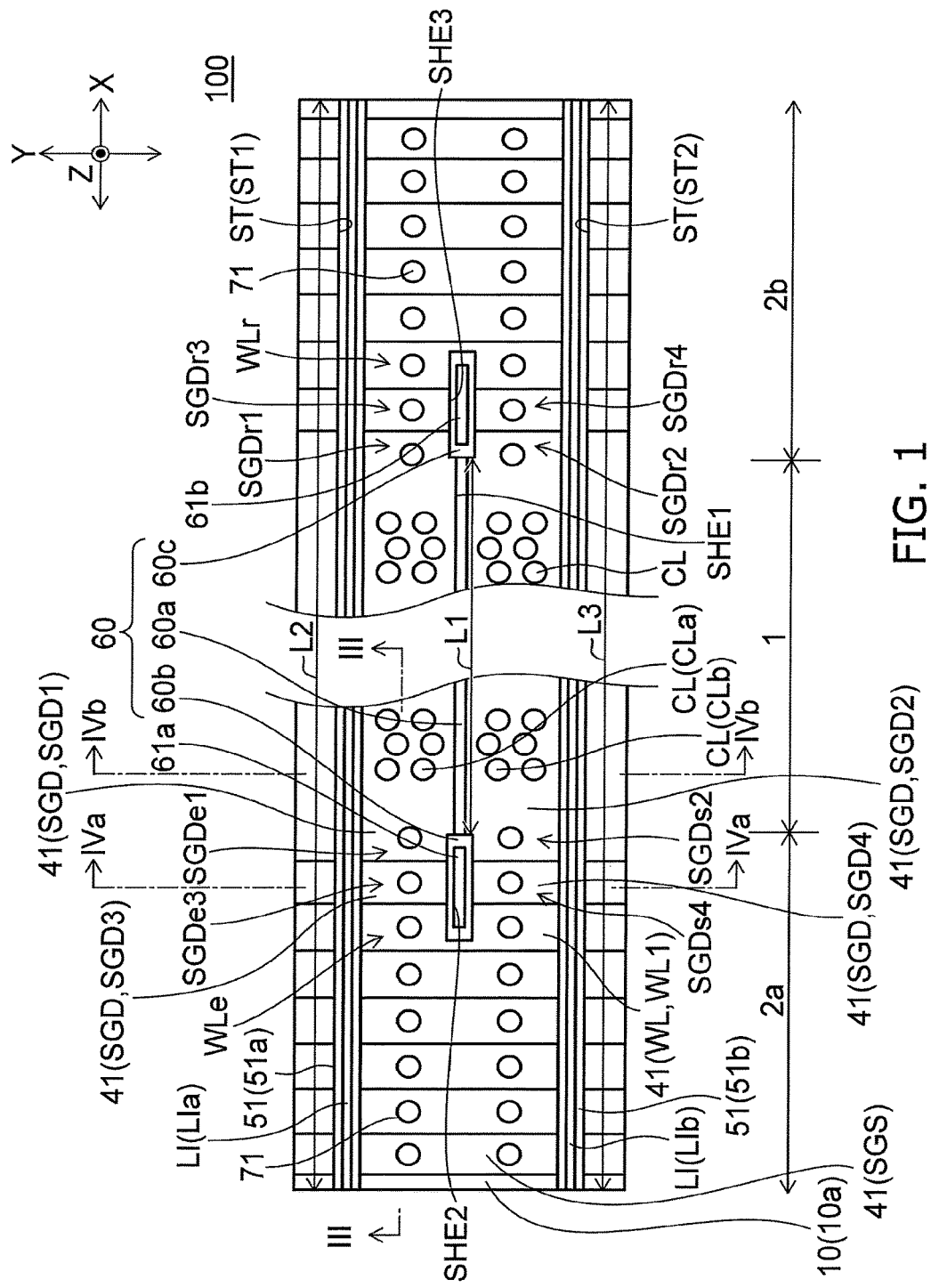
FIG. 1 is a schematic plan view showing a planar layout of a semiconductor device of a first embodiment.

A semiconductor device includes a stacked body, an insulating portion and a plurality of columnar portions. The stacked body includes a first selection gate electrode layer, a second selection gate electrode layer, a word line, a third selection gate electrode layer and a fourth selection gate electrode layer. The first selection gate electrode layer extends along a first direction and includes a first end portion. The second selection gate electrode layer is arranged with the first selection gate electrode layer in a second direction crossing the first direction. The second selection gate electrode layer extends along the first direction and includes a second end portion. The word line extends along the first direction and is arranged in a third direction with the first selection gate electrode layer and the second selection gate electrode layer. The third direction crosses the first direction and the second direction. The third selection gate electrode layer extends along the first direction and is provided between the first selection gate electrode layer and the word line. The third selection gate electrode layer includes a third end portion. The fourth selection gate electrode layer extends along the first direction. The fourth selection gate electrode layer is provided between the second selection gate electrode layer and the word line, and is arranged in the second direction with the third selection gate electrode layer. The fourth selection gate electrode layer includes a fourth end portion. The insulating portion includes a first portion and a second portion. The first portion extends along the first direction between the first selection gate electrode layer and the second selection gate electrode layer and between a portion of the third selection gate electrode layer and a portion of the fourth selection gate electrode layer. The first portion overlaps a portion of the word line in the third direction. The second portion extends in the third direction between the third end portion and the fourth end portion and through the word line. The second portion contacts the first portion. The plurality of columnar portions extend along the third direction through the stacked body, and are separated from the insulating portion.

Hereinafter, embodiments will be described with reference to the drawings. In the drawings, the same reference numerals are attached to the same elements. In the embodiment, "above" refers to, for example, a direction away from a base material, and "below" refers to a direction towards the base material. The semiconductor device of the embodiment is a semiconductor memory device having a memory cell array.

First Embodiment

<Semiconductor Device>

Figure 2:
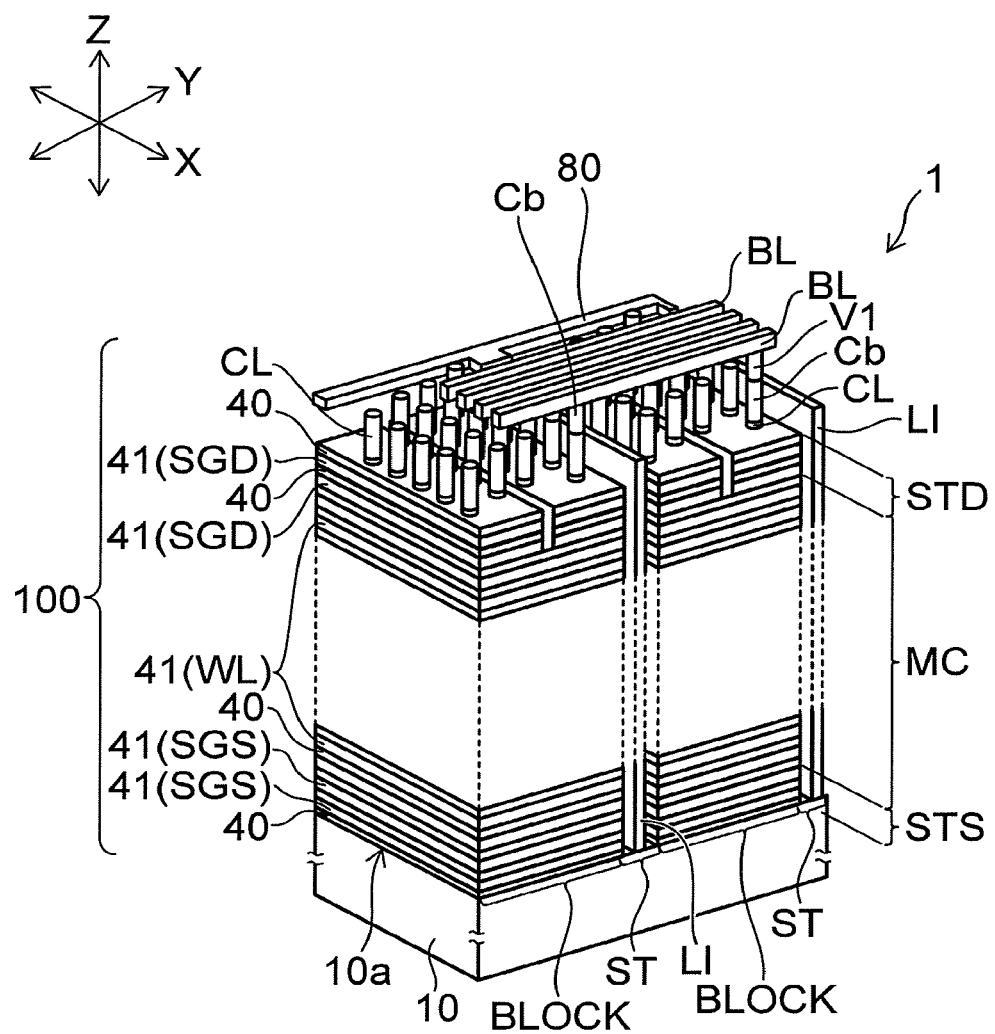
FIG. 2 is a schematic cross-sectional view showing a memory cell array of the semiconductor device of the first embodiment.
Figure 3:
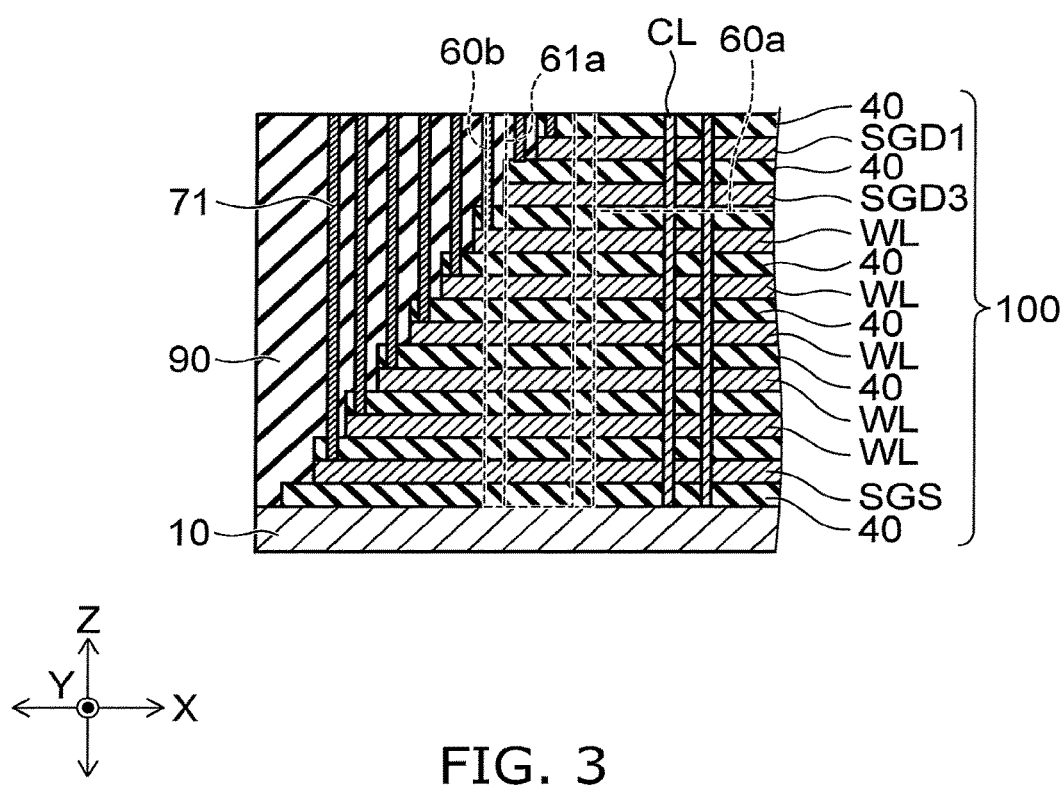
FIG. 3 is a schematic cross-sectional view showing the semiconductor device of the first embodiment.
Figure 4A:
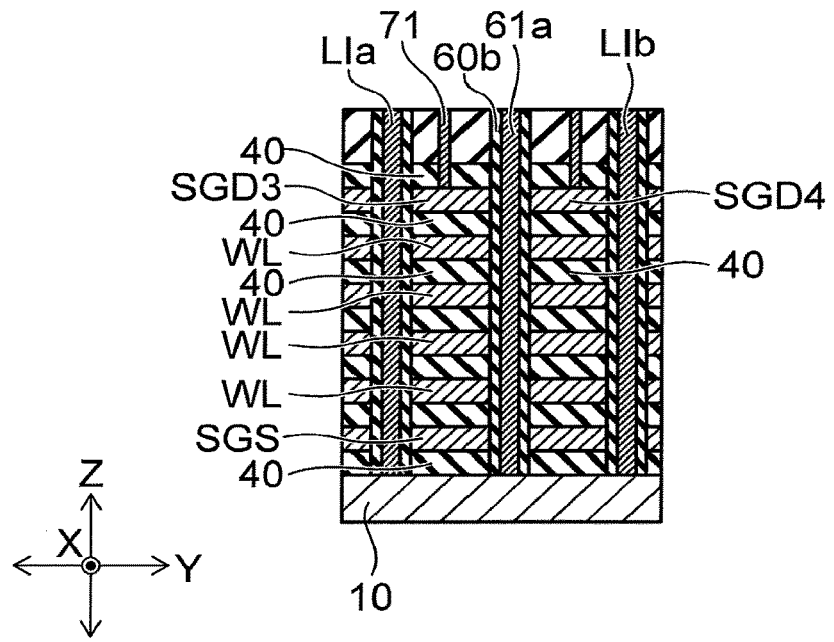
FIG. 4A and FIG. 4B are schematic cross-sectional views showing the semiconductor device of the first embodiment.
Figure 4B:
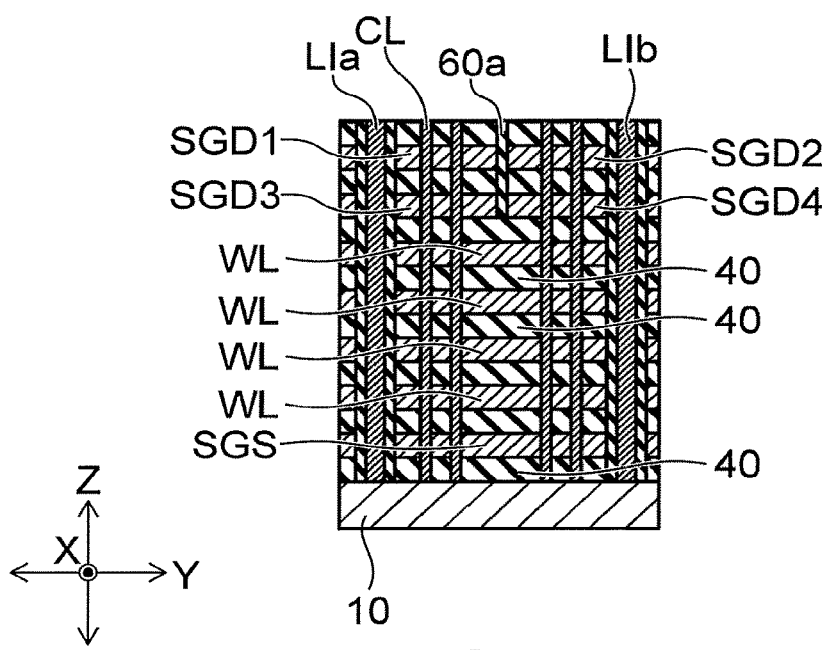

FIG. 1 is a schematic plan view showing the planar layout of a semiconductor device of a first embodiment. FIG. 2 is a schematic cross-sectional view showing a memory cell array of the semiconductor device of the first embodiment. FIG. 3 is a schematic cross-sectional view showing the semiconductor device of the first embodiment. FIG. 4A and FIG. 4B are schematic cross-sectional views showing the semiconductor device of the first embodiment. FIG. 3 is a schematic cross-sectional view showing a cross section along line III-III in FIG. 1. FIG. 4A is a schematic cross-sectional view showing a cross section along line IVa-IVa in FIG. 1. FIG. 4B is a schematic cross-sectional view showing a cross section along line IVb-IVb in FIG. 1.

In FIG. 1 to FIG. 4B, two mutually-orthogonal directions parallel to a major surface 10a of a base material 10 are taken as an X-direction and a Y-direction; and a direction orthogonal to both the X-direction and the Y-direction is taken as a Z-direction.

As shown in FIG. 1, the semiconductor device of the embodiment includes a memory cell array 1, a staircase portion 2a, and a staircase portion 2b. The memory cell array 1, the staircase portion 2a, and the staircase portion 2b are provided on the major surface 10a of the base material 10.

The memory cell array 1 is positioned between the staircase portion 2a and the staircase portion 2b in the X-direction. The base material is, for example, a semiconductor substrate. The semiconductor substrate includes, for example, silicon. The conductivity type of the base material 10 is, for example, a p-type.

As shown in FIG. 1 and FIG. 2, the semiconductor device of the embodiment includes a stacked body 100, multiple source lines LI, multiple insulating films 51, multiple columnar portions CL, an insulating portion 60, bit lines BL, and an upper layer interconnect 80. The stacked body 100 is provided on the major surface 10a of the base material 10. As shown in FIG. 1, the stacked body 100 is provided as one body with the memory cell array 1, the staircase portion 2a, and the staircase portion 2b.

The insulating films 51 extend in the Z-direction and the X-direction through the stacked body 100. The insulating films 51 divide the stacked body 100 into a plurality in the Y-direction. Each region that is divided by the insulating films 51 is called a "block." The source lines LI are provided inside the insulating films 51. For example, the source lines LI extend in the Z-direction and the X-direction. The source lines LI are electrically connected to the base material 10.

The insulating films 51 include, for example, silicon oxide. The source lines LI include a conductor. For example, the conductor includes at least one of tungsten or titanium. The source lines LI may include, for example, a stacked film of a titanium and titanium nitride film.

The multiple columnar portions CL extend in the Z-direction through the stacked body 100 of the memory cell array 1. For example, the configurations of the columnar portions CL are circular columnar configurations or elliptical columnar configurations. For example, the columnar portions CL are arranged in a staggered lattice configuration or a square lattice configuration.

The stacked body 100 includes multiple electrode layers 41 stacked with insulating bodies 40 interposed. For example, the multiple electrode layers 41 include multiple drain-side selection gate electrode layers SGD, multiple word lines WL, and multiple source-side selection gate electrode layers SGS.

As shown in FIG. 2, the source-side selection gate electrode layers SGS are provided on the major surface 10a of the base material 10 with the insulating body 40 interposed. The word lines WL are provided on the source-side selection gate electrode layers SGS with the insulating body 40 interposed. The word lines WL are stacked with the insulating bodies 40 interposed. The drain-side selection gate electrode layers SGD are provided on the word line WL of the uppermost layer with the insulating body 40 interposed. The number of stacks of the drain-side selection gate electrode layers SGD, the number of stacks of the word lines WL, and the number of stacks of the source-side selection gate electrode layers SGS are arbitrary. For example, the number of stacks of the drain-side selection gate electrode layers SGD is two layers. For example, the number of stacks of the source-side selection gate electrode layers SGS is two layers.

The drain-side selection gate electrode layer SGD functions as a gate electrode of a drain-side selection transistor STD. The source-side selection gate electrode layer SGS functions as a gate electrode of a source-side selection transistor STS. The word line WL functions as a gate electrode of a memory cell MC. The multiple memory cells MC are connected in series between the drain-side selection transistors STD and the source-side selection transistors STS. The drain-side selection transistors STD, the source-side selection transistors STS, and the memory cells MC are disposed at the columnar portion CL.

The electrode layers 41 (SGD, WL, and SGS) include, for example, a conductor such as tungsten, etc. The insulating body 40 may be an insulator such as a silicon oxide film, etc., or may include an air gap.

As shown in FIG. 1, the insulating portion 60 is provided inside the stacked body 100 divided by two insulating films 51. The insulating portion 60 is provided in the staircase portion 2a, the memory cell array 1, and the staircase portion 2b. The insulating portion 60 is provided inside a block and divides the drain-side selection gate electrode layer SGD. In other words, the insulating portion 60 is disposed between two drain-side selection gate electrode layers SGD adjacent to each other in the Y-direction inside the block. The region between the insulating portion 60 and the insulating film 51 is called a "finger." The word lines WL and the source-side selection gate electrode layers SGS are not divided by the insulating portion 60.

As shown in FIG. 1, FIG. 4A, and FIG. 4B, the insulating portion 60 includes a first portion 60a, a second portion 60b, and a third portion 60c. The first portion 60a is disposed in the memory cell array 1. The first portion 60a is provided on the word lines WL and is disposed between two drain-side selection gate electrode layers SGD adjacent to each other in the Y-direction. The second portion 60b is provided in the staircase portion 2a and extends along the Z-direction through the stacked body 100. The second portion 60b contacts the first portion 60a. The third portion 60c is provided in the staircase portion 2b opposite to the staircase portion 2a where the second portion 60b is provided. The third portion 60c extends along the Z-direction through the stacked body 100. The third portion 60c contacts the first portion 60a. A conductive portion 61a is provided inside the second portion 60b. The conductive portion 61a extends along the Z-direction through the second portion 60b. A conductive portion 61b is provided inside the third portion 60c. The conductive portion 61b extends along the Z-direction through the third portion 60c. For example, the conductive portion 61a is electrically connected to the base material 10. For example, the conductive portion 61b is electrically connected to the base material 10. For example, at least one of the conductive portion 61a or the conductive portion 61b may be used as an interconnect electrically connecting the base material 10 and an interconnect provided in the upper layer.

As shown in FIG. 3, the end portions of the multiple electrode layers 41 are drawn out in a staircase configuration in the staircase portion 2a. The semiconductor device of the embodiment includes an insulating layer 90 and multiple contact portions 71. The insulating layer 90 is provided on the staircase portion 2a of the stacked body 100. The contact portions 71 extend in the Z-direction through the insulating layer 90. The contact portions 71 are electrically connected to the electrode layers 41 drawn out to the staircase portion 2a. The number of the contact portions 71 connected to each of the electrode layers 41 is arbitrary. For example, in the semiconductor device of the embodiment, the structure of the staircase portion 2b is similar to that of the staircase portion 2a.

As shown in FIG. 1, FIG. 4A, and FIG. 4B, the multiple drain-side selection gate electrode layers SGD include, for example, a first selection gate electrode layer SGD1, a second selection gate electrode layer SGD2, a third selection gate electrode layer SGD3, and a fourth selection gate electrode layer SGD4. For example, the multiple word lines WL include a first word line WL1. For example, the first word line WL1 is the word line WL of the multiple word lines WL stacked on the base material 10 that is most distal to the base material 10.

The first selection gate electrode layer SGD1 extends along the X-direction. The second selection gate electrode layer SGD2 extends along the X-direction and is arranged with the first selection gate electrode layer SGD1 in the Y-direction. The first selection gate electrode layer SGD1 and the second selection gate electrode layer SGD2 are arranged in the Z-direction with the first word line WL1. The third selection gate electrode layer SGD3 is provided between the first word line WL1 and the first selection gate electrode layer SGD1 and extends along the X-direction. The fourth selection gate electrode layer SGD4 is provided between the first word line WL1 and the second selection gate electrode layer SGD2 and extends along the X-direction.

As shown in FIG. 1, the first selection gate electrode layer SGD1 includes a first end portion SGDe1, and a first opposite end portion SGDr1 on the side opposite to the first end portion SGDe1. The first end portion SGDe1 is positioned in the staircase portion 2a; and the first opposite end portion SGDr1 is positioned in the staircase portion 2b.

The second selection gate electrode layer SGD2 includes a second end portion SGDe2, and a second opposite end portion SGDr2 on the side opposite to the second end portion SGDe2. The second end portion SGDe2 is positioned in the staircase portion 2a; and the second opposite end portion SGDr2 is positioned in the staircase portion 2b.

The third selection gate electrode layer SGD3 includes a third end portion SGDe3, and a third opposite end portion SGDr3 on the side opposite to the third end portion SGDe3. The third end portion SGDe3 is positioned in the staircase portion 2a; and the third opposite end portion SGDr3 is positioned in the staircase portion 2b.

The fourth selection gate electrode layer SGD4 includes a fourth end portion SGDe4, and a fourth opposite end portion SGDr4 on the side opposite to the fourth end portion SGDe4. The fourth end portion SGDe4 is positioned in the staircase portion 2a; and the fourth opposite end portion SGDr4 is positioned in the staircase portion 2b.

The first word line WL1 includes a fifth end portion WLe, and a fifth opposite end portion WLr on the side opposite to the fifth end portion WLe.

As shown in FIG. 1 and FIG. 4B, the first portion 60a is provided on the first word line WL1. The first portion 60a extends along the X-direction between the first selection gate electrode layer SGD1 and the second selection gate electrode layer SGD2 and between a portion of the third selection gate electrode layer SGD3 and a portion of the fourth selection gate electrode layer SGD4.

As shown in FIG. 1 and FIG. 4A, the second portion 60b extends in the Z-direction between the third end portion SGDe3 and the fourth end portion SGDe4 and through the first word line WL1. A portion of the second portion 60b may be provided between the first end portion SGDe1 and the second end portion SGDe2.

As shown in FIG. 1, the third portion 60c extends in the Z-direction between the third opposite end portion SGDr3 and the fourth opposite end portion SGDr4 and through the first word line WL1.

The multiple columnar portions CL include, for example, a columnar portion CLa and a columnar portion CLb. The columnar portion CLa extends along the Z-direction through the first selection gate electrode layer SGD1, the third selection gate electrode layer SGD3, and the first word line WL1 and is connected to the base material 10. The columnar portion CLb extends along the Z-direction through the second selection gate electrode layer SGD2, the fourth selection gate electrode layer SGD4, and the first word line WL1 and is connected to the base material 10.

The first end portion SGDe1 is positioned between the columnar portion CLa and the third end portion SGDe3 in the X-direction. The second end portion SGDe2 is positioned between the columnar portion CLb and the fourth end portion SGDe4 in the X-direction. The third end portion SGDe3 is positioned between the first end portion SGDe1 and the fifth end portion WLe in the X-direction. The fourth end portion SGDe4 is positioned between the second end portion SGDe2 and the fifth end portion WLe in the X-direction.

The first opposite end portion SGDr1 is positioned between the columnar portion CLa and the third opposite end portion SGDr3 in the X-direction. The second opposite end portion SGDr2 is positioned between the columnar portion CLb and the fourth opposite end portion SGDr4 in the X-direction. The third opposite end portion SGDr3 is positioned between the first opposite end portion SGDr1 and the fifth opposite end portion WLr in the X-direction. The fourth opposite end portion SGDr4 is positioned between the second opposite end portion SGDr2 and the fifth opposite end portion WLr in the X-direction.

The multiple insulating films 51 include an insulating film 51a and an insulating film 51b. The insulating film 51a extends in the X-direction and the Z-direction through the stacked body 100. The multiple source lines LI include a source line LIa and a source line LIb. The source line LIa is provided inside the insulating film 51a and is electrically connected to the base material 10. The source line LIb is provided inside the insulating film 51b and is electrically connected to the base material 10.

The first selection gate electrode layer SGD1 and the third selection gate electrode layer SGD3 are disposed between the insulating film 51a and the insulating portion 60. The second selection gate electrode layer SGD2 and the fourth selection gate electrode layer SGD4 are disposed between the insulating film 51b and the insulating portion 60.

A length L1 in the X-direction of the insulating portion 60 is shorter than a length L2 in the X-direction of the insulating film 51a. The length L1 in the X-direction of the insulating portion 60 is shorter than a length L3 in the X-direction of the insulating film 51b.

As shown in FIG. 2, the bit line BL is provided on the columnar portion CL. The bit line BL extends in the Y-direction. The upper end portion of the columnar portion CL is electrically connected to one of the bit lines BL via, for example, a contact portion Cb and a contact portion V1. One bit line BL is electrically connected to one columnar portion CL disposed in each finger. The lower end portions of the columnar portions CL are electrically connected to the source lines LI via the base material 10.

The upper layer interconnect 80 is provided on the source lines LI. The upper layer interconnect 80 extends in the Y-direction. The upper layer interconnect 80 is electrically connected to the source lines LI. The upper layer interconnect 80 is electrically connected to a not-illustrated peripheral circuit.

A semiconductor device may be considered in which the insulating portion 60 that does not include the second portion 60b and the third portion 60c is provided. The insulating portion 60 is provided on the first word line WL1 and divides the two drain-side selection gate electrode layers SGD in the Y-direction. For example, the insulating portion 60 is formed by forming a slit dividing the two drain-side selection gate electrode layers SGD in the Y-direction by etching, and by subsequently providing an insulator inside the slit. In the case where the drain-side selection gate electrode layers SGD are multiply provided in the Z-direction, the insulating layer 90 is provided on the end portion of the drain-side selection gate electrode layer SGD of the lower layer. In such a case, the insulating layer 90 may become a mask when forming the slit; and the end portion of the drain-side selection gate electrode layer SGD may not be divided by the etching. Thereby, there are cases where the two drain-side selection gate electrode layers SGD arranged in the Y-direction are shorted.

In the embodiment, the insulating portion 60 that includes the first portion 60a, the second portion 60b, and the third portion 60c is provided. The second portion 60b and the third portion 60c each divide the end portions of the drain-side selection gate electrode layers SGD and extend in the Z-direction through the first word line WL1. Thereby, the end portions of the two drain-side selection gate electrode layers SGD arranged in the Y-direction can be divided with higher certainty. Accordingly, the shorts of the two drain-side selection gate electrode layers SGD arranged in the Y-direction are suppressed. Thereby, for example, the degree of difficulty of the patterning of the stacked body can be reduced.

The conductive portion 61a is provided inside the second portion 60b; and the conductive portion 61b is provided inside the third portion 60c. The conductive portion 61a and the conductive portion 61b each are connected to the base material 10. For example, the conductive portion 61a and the conductive portion 61b can be used as interconnects electrically connecting the base material and an interconnect of the upper layer. The spaces made by dividing the end portions of the drain-side selection gate electrode layers SGD can be utilized as spaces of interconnects (the conductive portion 61a and the conductive portion 61b). Thereby, for example, the size of the semiconductor device can be reduced.

In the embodiment, the conductive portion 61a may not be provided inside the second portion 60b. The conductive portion 61b may not be provided inside the third portion 60c.

Figure 5:
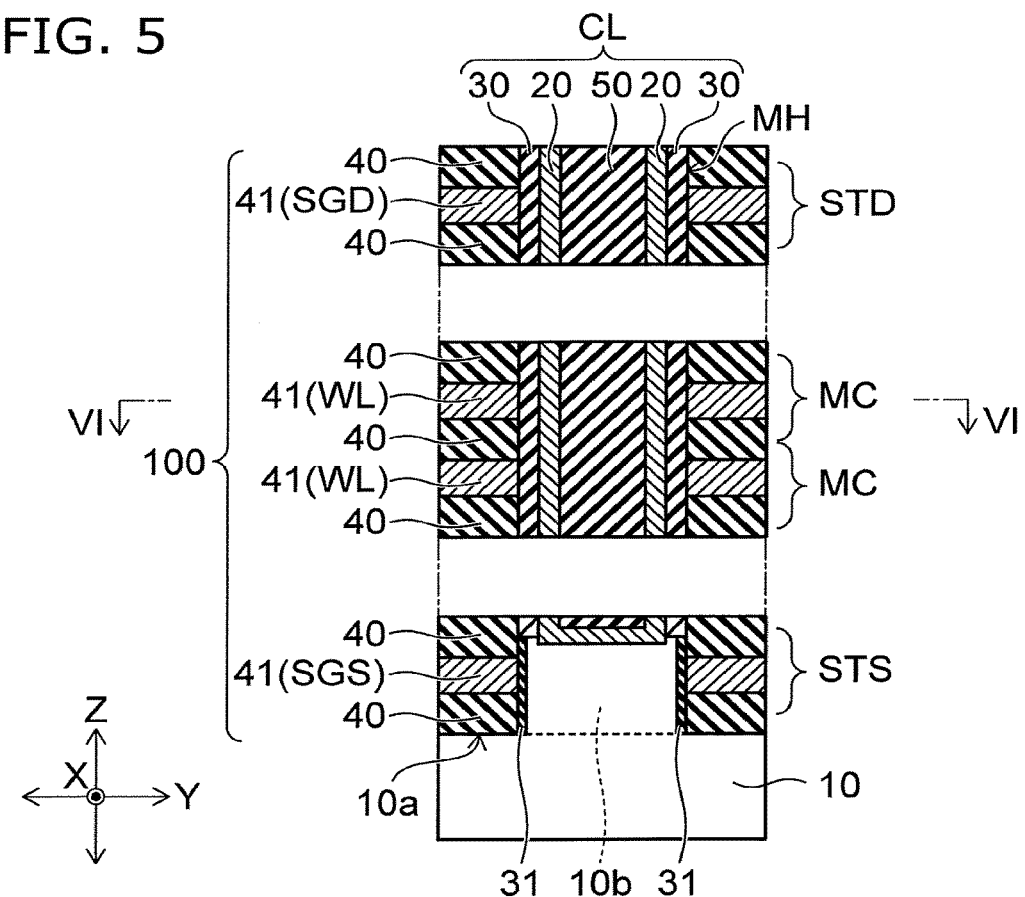
FIG. 5 is a schematic cross-sectional view showing an example of a columnar portion.
Figure 6:
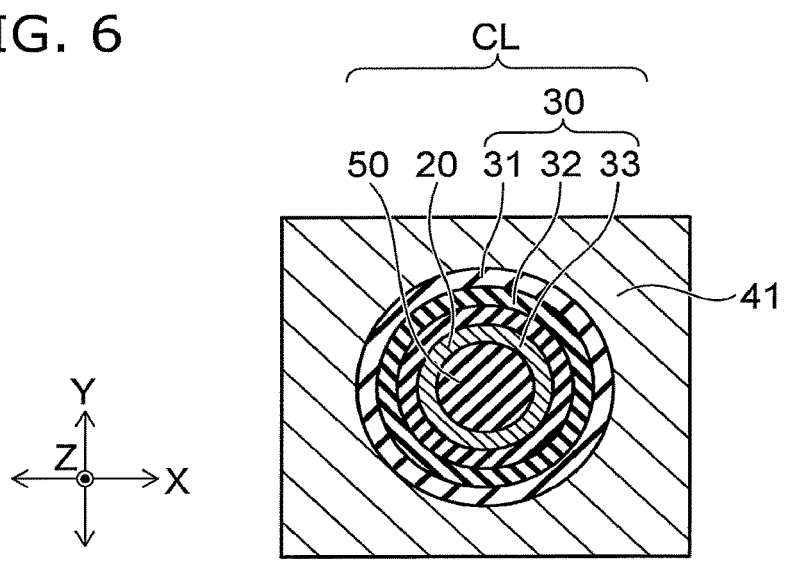
FIG. 6 is a schematic cross-sectional view showing the example of the columnar portion.

FIG. 5 is a schematic cross-sectional view showing an example of the columnar portion. FIG. 6 is a schematic cross-sectional view showing the example of the columnar portion. FIG. 6 is a schematic cross-sectional view along line VI-VI in FIG. 5.

As shown in FIG. 5, the columnar portion CL includes a core portion 50, a semiconductor film 20, and a memory film 30.

The core portion 50 extends along the Z-direction through the stacked body 100. The semiconductor film 20 is provided between the core portion 50 and the stacked body 100. The memory film 30 is provided between the semiconductor film 20 and the stacked body 100.

As shown in FIG. 6, the memory film 30 includes a charge storage portion 32 inside a film. The charge storage portion 32 includes, for example, at least one of a floating gate or trap sites that trap charge. The threshold voltage of the memory cell MC changes due to the existence or absence of the charge or the amount of the charge inside the charge storage portion 32. Thereby, the memory cell MC stores information.

A tunneling insulating film 33 is provided between the semiconductor film 20 and the charge storage portion 32. A blocking insulating film 31 is provided between the charge storage portion 32 and the stacked body 100.

Tunneling of the charge, e.g., electrons and/or holes, occurs in the tunneling insulating film 33 when erasing the information and when programming the information. The memory film 30 may be removed between the semiconductor film 20 and the drain-side selection gate electrode layers SGD. In such a case, an insulating film is provided instead of the memory film 30.

For example, the blocking insulating film 31 suppresses back-tunneling of the charge in the erase operation from the word lines WL to the charge storage portion 32 included in the memory film 30.

For example, a semiconductor pillar 10b may be provided between the columnar portion CL and the base material 10. For example, the semiconductor film 20 is electrically connected to the base material 10 via the semiconductor pillar 10b. The blocking insulating film 31 is provided between the semiconductor pillar 10b and the stacked body 100. For example, the semiconductor pillar 10b opposes the source-side selection gate electrode layer SGS with the blocking insulating film 31 interposed in a direction orthogonal to the Z-direction. The semiconductor pillar 10b may be omitted. In the case where the semiconductor pillar 10b is omitted, for example, the columnar portion CL is connected directly to the base material 10.

<Method for Manufacturing Semiconductor Device>

Figure 7:
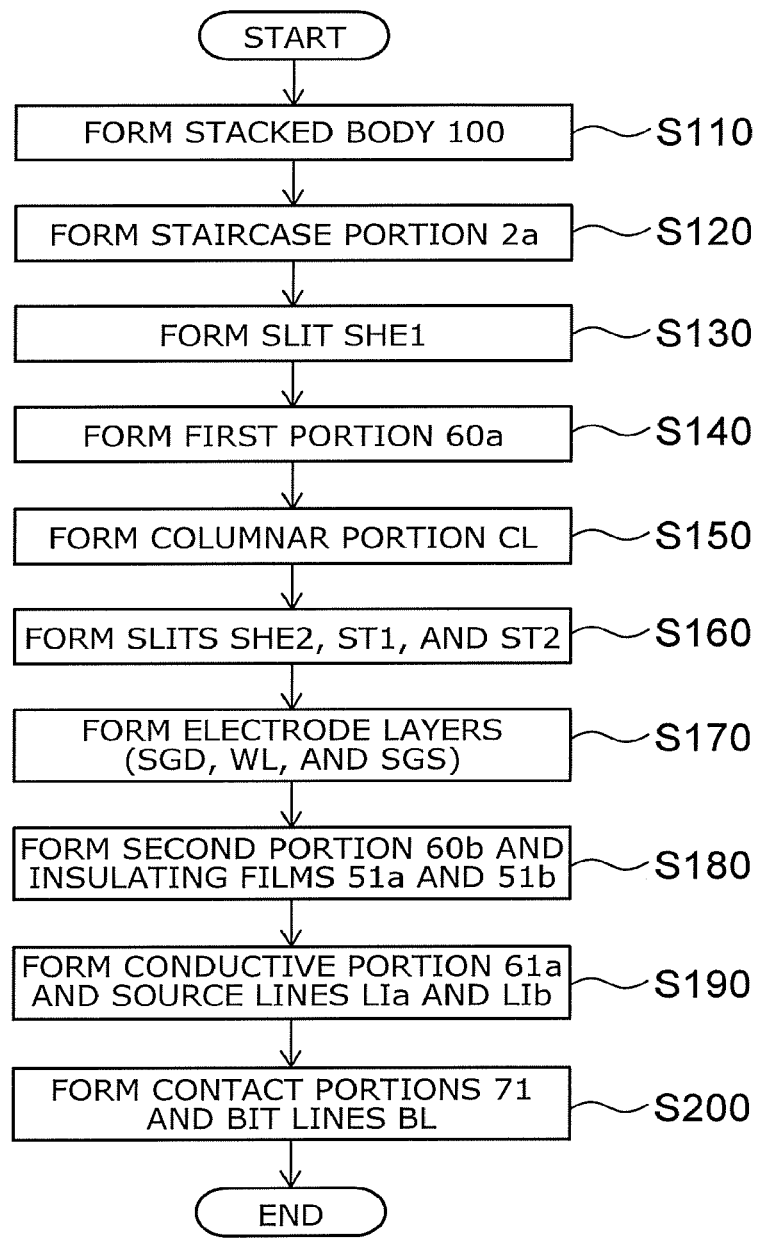
FIG. 7 is a flowchart showing an example of a method for manufacturing the semiconductor device of the first embodiment.
Figure 8A:
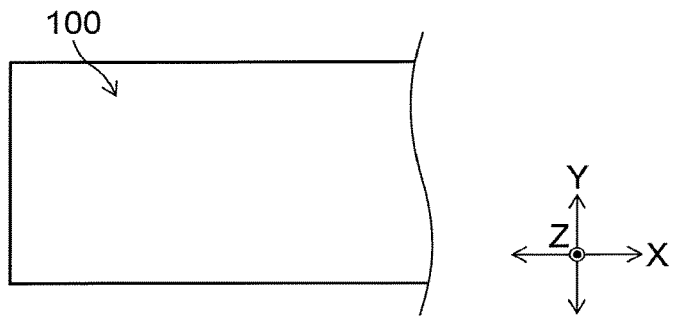
Figure 8B:
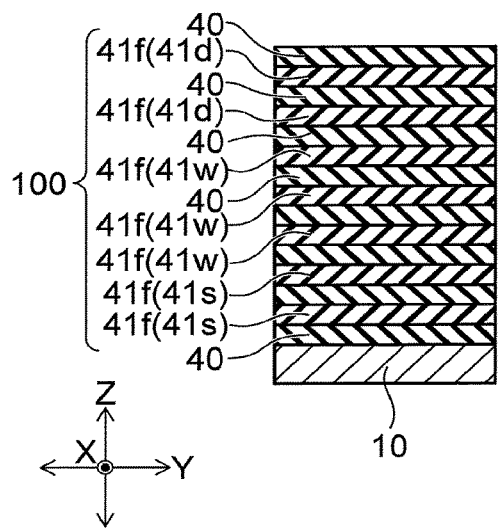
Figure 8C:
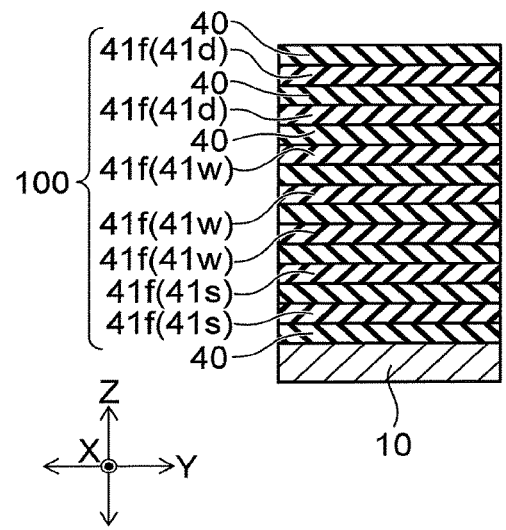
Figure 8D:
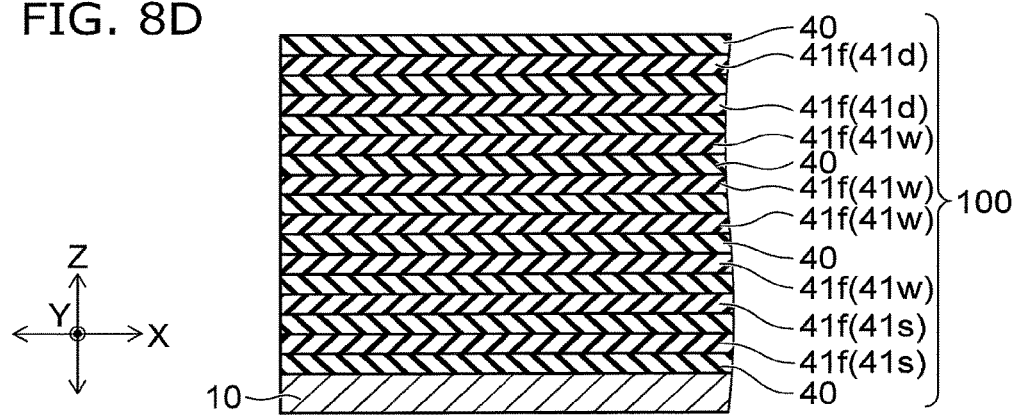
Figure 11A:
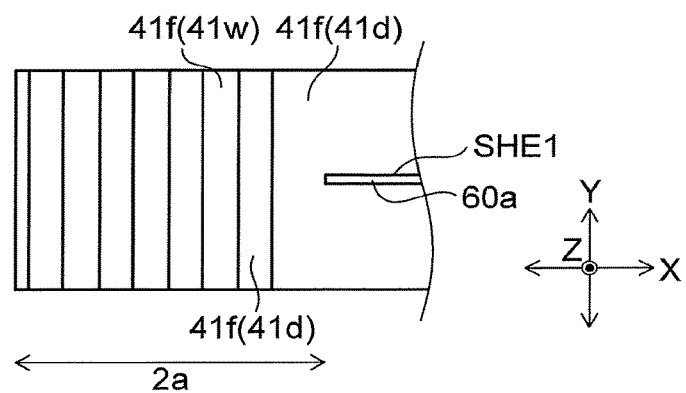
Figure 11B:
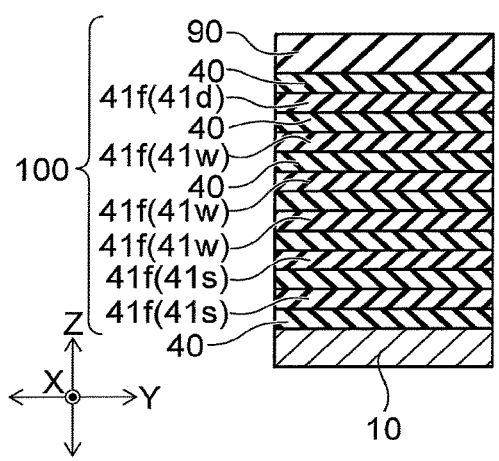
Figure 11C:
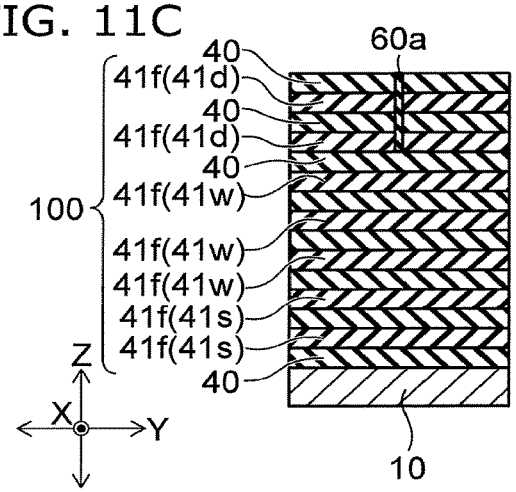
Figure 11D:
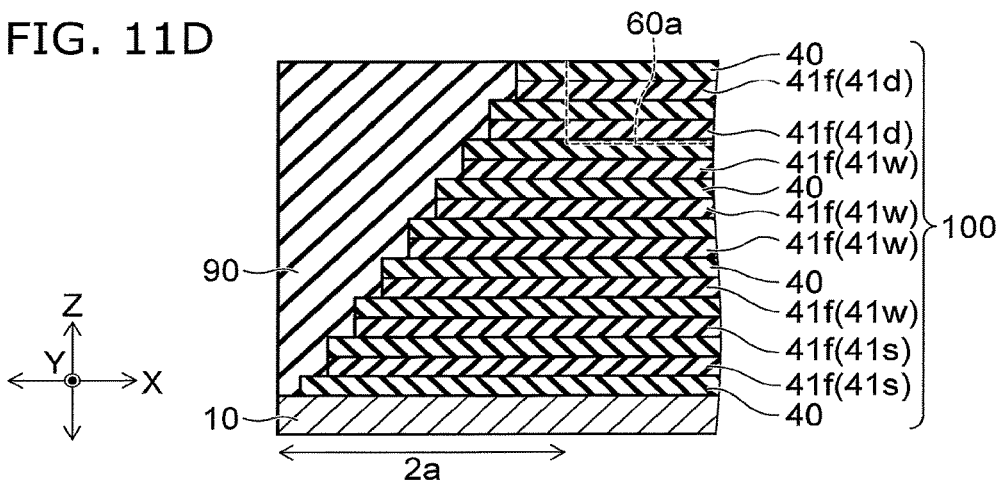
Figure 12A:
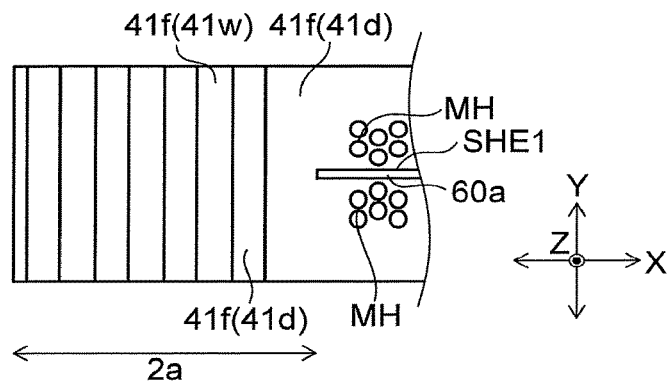
Figure 12B:
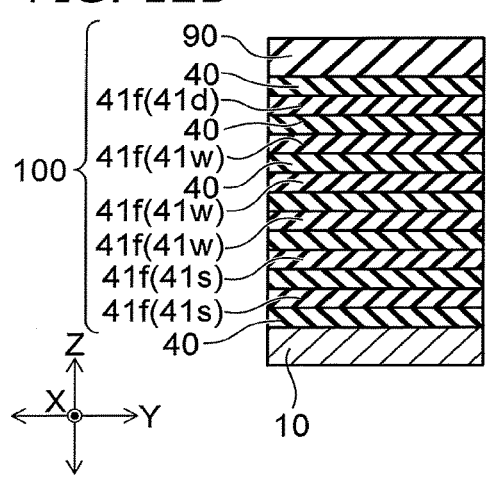
Figure 12C:
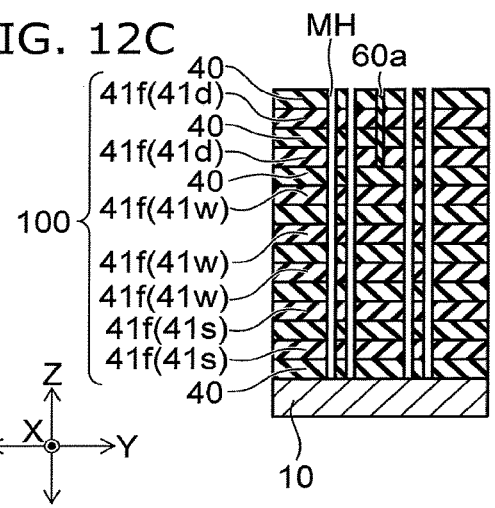
Figure 12D:
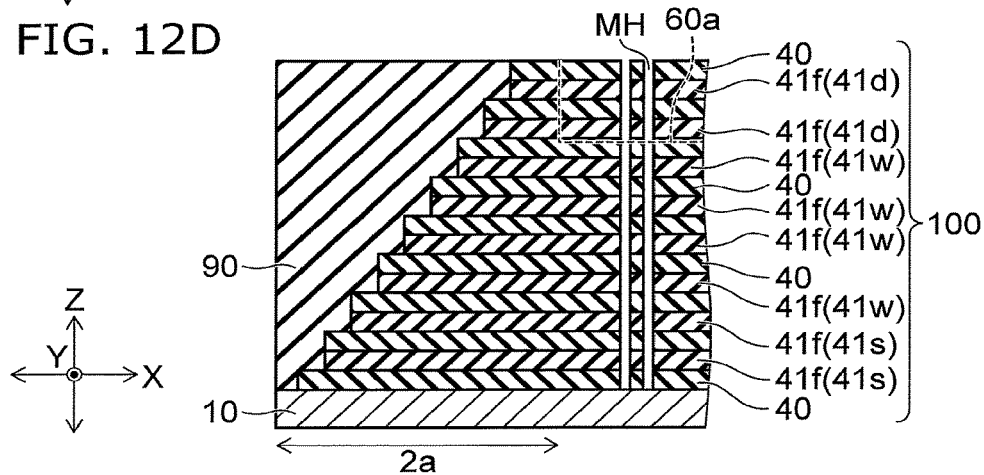
Figure 13A:
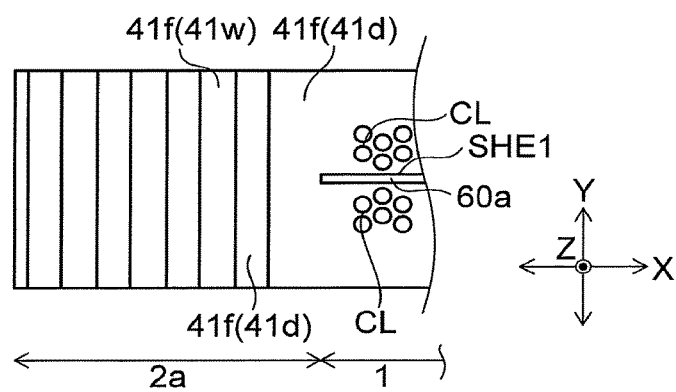
Figure 13B:
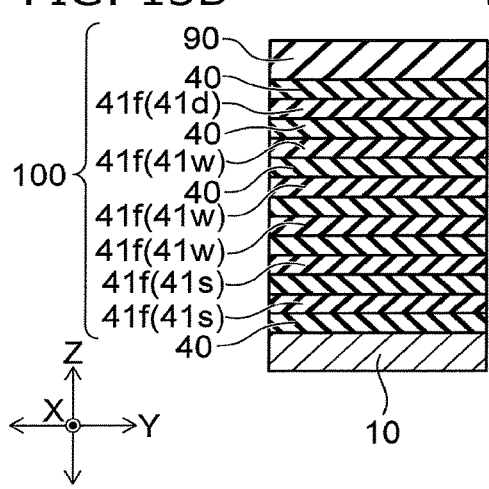
Figure 13C:
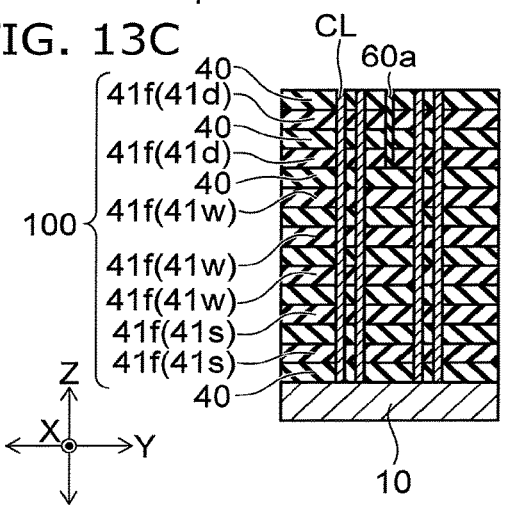
Figure 13D:
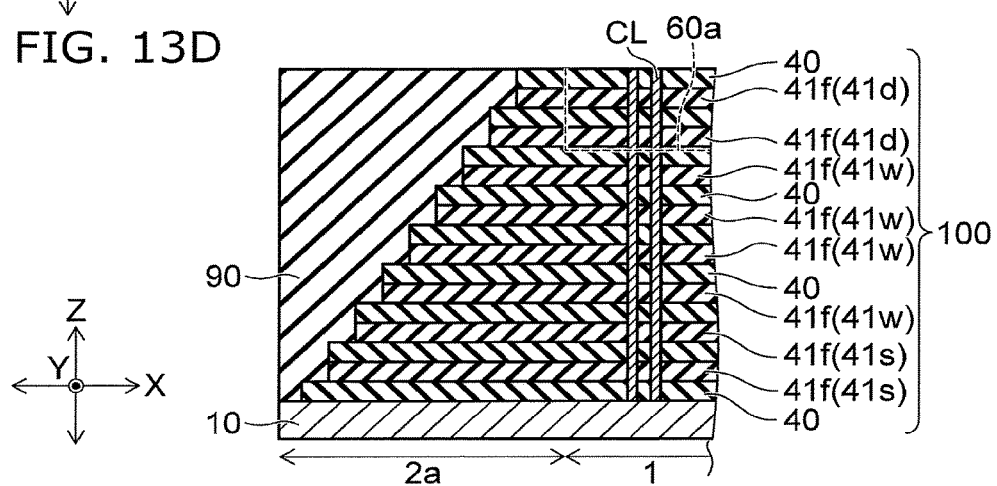
Figure 14A:
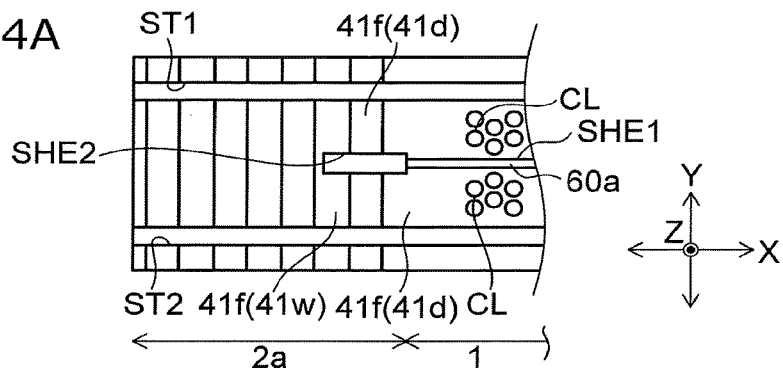
Figure 14B:
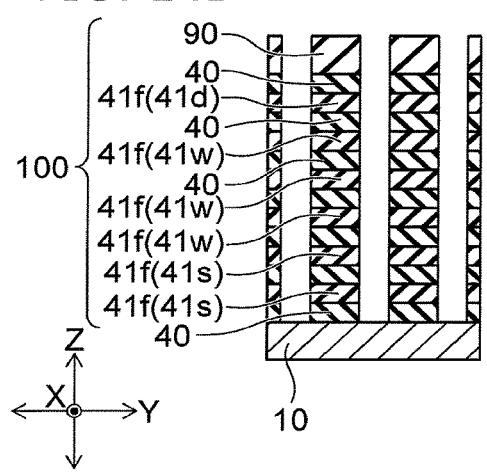
Figure 14C:
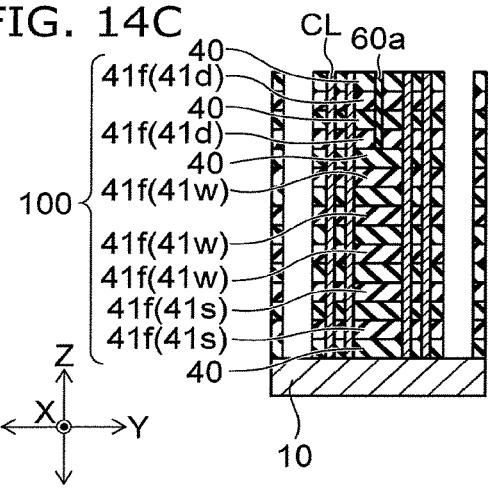
Figure 14D:
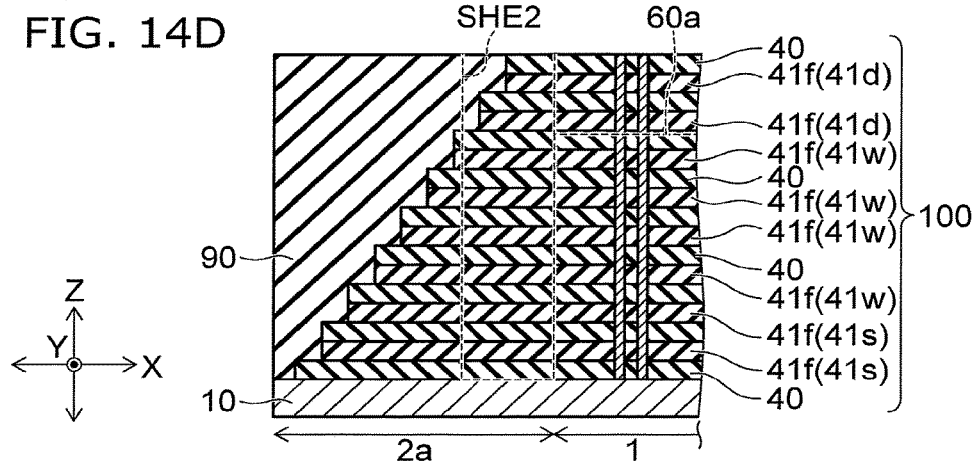
Figure 15A:
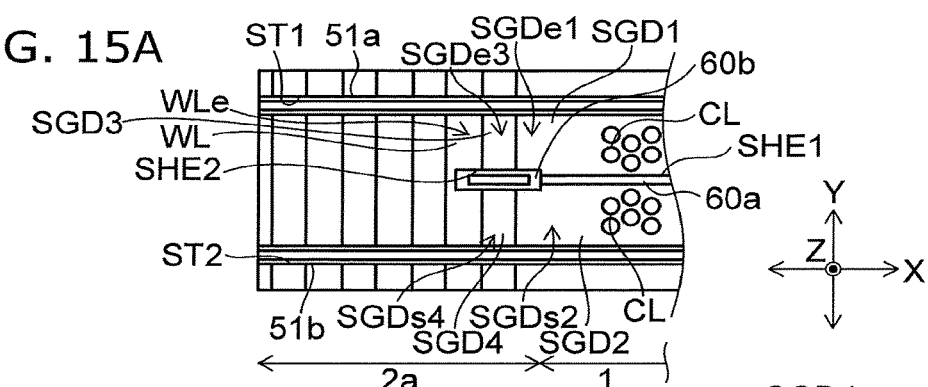
Figure 15B:
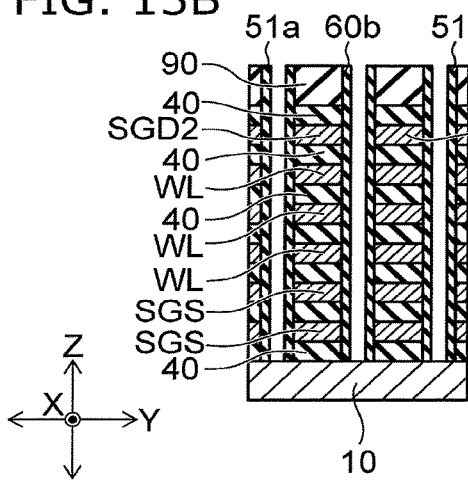
Figure 15C:
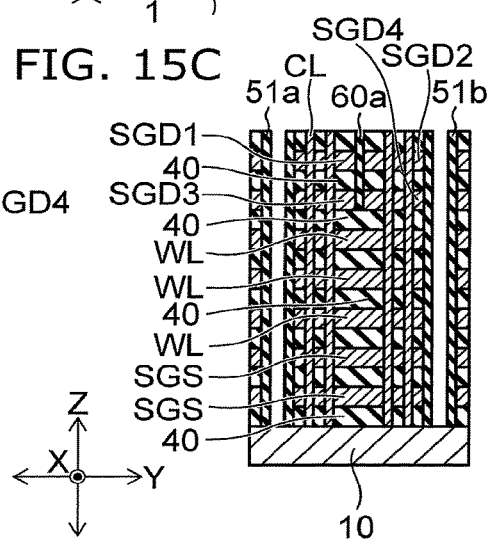
Figure 15D:
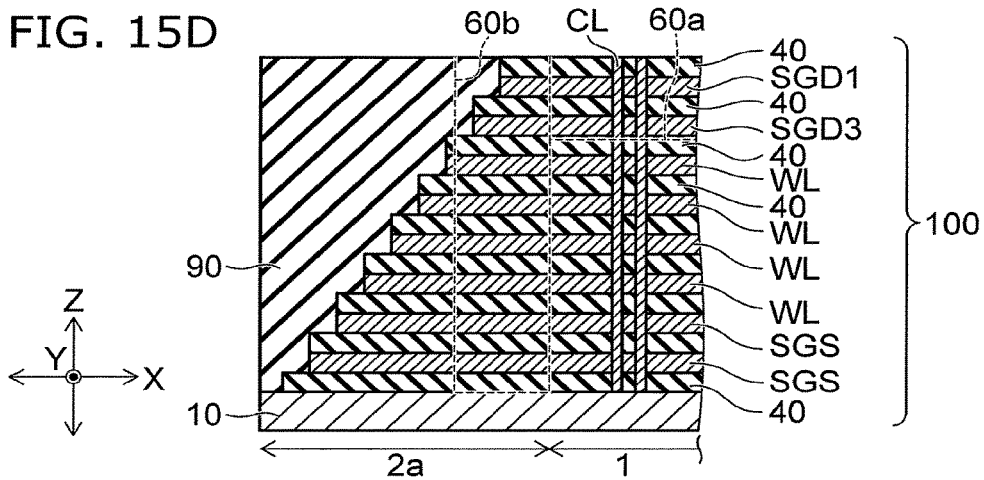

FIG. 7 is a flowchart showing an example of a method for manufacturing the semiconductor device of the embodiment. FIG. 8A to FIG. 16D are schematic views showing the method for manufacturing the semiconductor device of the embodiment.

FIG. 8A, FIG. 9A, FIG. 10A, FIG. 11A, FIG. 12A, FIG. 13A, FIG. 14A, FIG. 15A, and FIG. 16A are schematic plan views showing a region corresponding to the memory cell array and the staircase portion shown in FIG. 1. FIG. 8B, FIG. 9B, FIG. 10B, FIG. 11B, FIG. 12B, FIG. 13B, FIG. 14B, FIG. 15B, and FIG. 16B are schematic cross-sectional views corresponding to the cross section shown in FIG. 4A. FIG. 8C, FIG. 9C, FIG. 10C, FIG. 11C, FIG. 12C, FIG. 13C, FIG. 14C, FIG. 15C, and FIG. 16C are schematic cross-sectional views corresponding to the cross section shown in FIG. 4B. FIG. 8D, FIG. 9D, FIG. 10D, FIG. 11D, FIG. 12D, FIG. 13D, FIG. 14D, FIG. 15D, and FIG. 16D are schematic cross-sectional views corresponding to the cross section shown in FIG. 3.

<Formation of Stacked Body 100>

As shown in FIG. 8A to FIG. 8D, the stacked body 100 is formed on the base material 10 (step S110). The stacked body 100 is the state in which replacement members 41f and the insulating bodies 40 are stacked alternately. The material of the replacement members 41f is selected from a material that can have etching selectivity with the insulating bodies 40. For example, when silicon oxide is selected as the insulating bodies 40, silicon nitride is selected as the replacement members 41f. The replacement members 41f are subsequently replaced with the electrode layers 41 (SGD, WL, and SGS). For example, the replacement members 41f include replacement members 41d subsequently replaced with the drain-side selection gate electrode layers SGD, replacement members 41w subsequently replaced with the word lines WL, and replacement members 41s subsequently replaced with the source-side selection gate electrode layers SGS.

<Formation of Staircase Portion 2a>

As shown in FIG. 9A to FIG. 9D, the end portion of the stacked body 100 is patterned into a staircase configuration (step S120). Here, of the stacked body 100, the staircase portion 2a is taken to be the end portion of the stacked body 100 patterned into the staircase configuration. The end portion on the side opposite to the staircase portion 2a also may be patterned into a staircase configuration. Thereby, the staircase portion 2b (referring to FIG. 1) is formed. The insulating layer 90 is formed on the staircase portion 2a (and the staircase portion 2b). The material of the insulating layer 90 is selected from a material that can have etching selectivity with the replacement members 41f. For example, silicon oxide which is the same material as the insulating bodies 40 is selected as the insulating layer 90. For example, the upper surface of the insulating layer 90 is in the same plane as the upper surface of the uppermost layer of the stacked body 100.

<Formation of Slit SHE1>

As shown in FIG. 10A to FIG. 10D, a slit SHE1 is formed in the stacked body 100 (step S130). The slit SHE1 extends in the X-direction through the region where the memory cell array 1 is formed subsequently. For example, the slit SHE1 is not formed in the staircase portion 2a (and the staircase portion 2b). For example, the slit SHE1 is formed by selectively etching the insulating bodies 40 and the replacement members 41d alternately. The height of the slit SHE1 can be controlled by changing the etching conditions of the insulating bodies 40 and the etching conditions of the replacement members 41d. Thereby, the slit SHE1 pierces from the stacked body 100 upper surface to the replacement members 41d.

As shown in FIG. 11A to FIG. 11D, the first portion 60a is formed by filling an insulator into the slit SHE1 (step S140). For example, silicon oxide is selected as the insulator.

<Formation of Columnar Portion CL>

As shown in FIG. 12A to FIG. 13D, the multiple columnar portions CL are formed inside the stacked body 100 (step S150). First, as shown in FIG. 12A to FIG. 12D, multiple memory holes MH are formed in the stacked body 100. For example, the memory holes MH are formed by anisotropic etching such as RIE (reactive ion etching), etc. The memory holes MH extend along the Z-direction through the stacked body 100. The bottoms of the memory holes MH reach the base material 10. The memory holes MH are separated from the staircase portion 2a (and the staircase portion 2b).

Subsequently, as shown in FIG. 13A to FIG. 13D, the columnar portions CL are formed inside the memory holes MH. The columnar portions CL are formed by a process of forming the memory film 30 on the side walls of the memory holes MH, a process of forming the semiconductor film 20 on the side wall of the memory film 30, and a process of forming the core portion 50 inside the memory holes MH. For example, the semiconductor film 20 contacts the base material 10. Thereby, the memory cell array 1 is formed in the stacked body 100.

<Formation of Slits SHE2, ST1, and ST2>

As shown in FIG. 14A to FIG. 14D, slits SHE2, ST1, and ST2 are formed in the stacked body 100 (step S160). The slit SHE2 is formed in the staircase portion 2a. The slit SHE2 divides the end portions of the replacement members 41d and extends along the Z-direction through the replacement members 41w and the replacement members 41s. Along the X-direction, the slit SHE2 contacts the first portion 60a. Thereby, the replacement members 41d are divided in the Y-direction with the first portion 60a and the slit SHE2 interposed. The slit ST1 and the slit ST2 extend in the X-direction and the Z-direction inside the memory cell array 1 and inside the staircase portion 2a (and the staircase portion 2b).

For example, in the case where the staircase portion 2b is provided in the stacked body 100, a slit SHE3 (referring to FIG. 1) may be formed in the staircase portion 2b. The slit SHE3 divides the end portions of the replacement members 41d and extends along the Z-direction through the replacement members 41w and the replacement members 41s.

For example, the slit SHE2, the slit ST1, and the slit ST2 are formed using RIE. The slit SHE2, the slit ST1, and the slit ST2 pierce the stacked body 100 and reach the base material 10. The slit SHE2 may be formed by a process other than the process of forming the slit ST1 and the slit ST2.

A method may be considered in which the end portions of the replacement members 41d are divided by the slit SHE1. In such a case, the slit SHE1 is formed by simultaneously etching the stacked body 100 formed inside the memory cell array 1 and inside the staircase portion 2a. The slit SHE1 is formed by etching (step etching) in which the insulating bodies 40 and the replacement members 41d are etched one layer at a time by multiple etching.

At this time, a difference between the etching rate of the replacement members 41d and the etching rate of the insulating layer 90 occurs when dividing the replacement member 41d of the first layer from the top of the stacked body 100. Thereby, etching that has different rates between the memory cell array 1 and the staircase portion 2a is performed. Accordingly, the fluctuation of the depth of the slit SHE1 becomes large. Thereby, when etching the replacement member 41d of the second layer, insufficient etching of the end portion of the replacement member 41d may occur. For example, the replacement members 41d may not be divided by the slit SHE1. Thereby, when replacing the replacement members 41d with the drain-side selection gate electrode layers SGD, there is a possibility of including portions in the shorted state. Accordingly, there are circumstances in which the degree of difficulty when patterning the drain-side selection gate electrode layers SGD becomes high. It also may be considered to collectively form the slit SHE1 by one etching. In such a case, the control of the depth of the slit SHE1 is difficult.

Conversely, in the embodiment, the slit SHE2 is formed inside the memory cell array 1 and inside the staircase portion 2a after forming the slit SHE1 inside the memory cell array 1. At this time, the slit SHE2 pierces the stacked body 100. Thereby, the drain-side selection gate electrode layers SGD are divided with the slit SHE1 and the slit SHE2 interposed. The formation of the drain-side selection gate electrode layers SGD in the shorted state is suppressed because the end portions of the replacement members 41d are divided more reliably by the slit SHE2. Thereby, for example, the drain-side selection gate electrode layers SGD can be patterned easily; and the degree of difficulty of the patterning of the stacked body 100 can be reduced.

<Formation of Electrode Layers 41 (SGD, WL, and SGS)>

As shown in FIG. 15A to FIG. 15D, the replacement members 41f are removed via the slit SHE2, the slit ST1, and the slit ST2. Subsequently, the electrode layers 41 (SGD, WL, and SGS) are formed in the space made by removing the replacement members 41f (step S170).

<Formation of Second Portion 60b and Insulating Films 51a and 51b>

As shown in FIG. 16A to FIG. 16D, an insulating film is formed on the side walls of the slit SHE2, the slit ST1, and the slit ST2. For example, silicon oxide is selected as the insulating film. Thereby, the second portion 60b is formed on the side wall of the slit SHE2. The insulating film 51a is formed on the side wall of the slit ST1. The insulating film 51b is formed on the side wall of the slit ST2 (step S180). Subsequently, the conductive portion 61a is formed inside the slit SHE2.

The source line LIa is formed inside the slit ST1. The source line LIb is formed inside the slit ST2 (step S190). A conductive material such as, for example, tungsten or the like is selected as the material of the conductive portion 61a, the source line LIa, and the source line LIb. The conductive portion 61a, the source line LIa, and the source line LIb each are electrically connected to the base material 10. The slit SHE2 may be filled with the second portion 60b instead of forming the conductive portion 61a inside the second portion 60b.

<Formation of Contact Portions 71 and Formation of Bit Lines BL, Etc.>

As shown in FIG. 1 and FIG. 3, the contact portions 71 are formed on the staircase portion 2a. The contact portions 71 pierce the insulating layer 90 and reach the electrode layers 41. Subsequently, as shown in FIG. 2, the bit lines BL, etc., are formed on the stacked body 100 (step S200).

The semiconductor device of the embodiment can be manufactured by implementing the processes recited above.

Second Embodiment

<Semiconductor Device>

Figure 17:
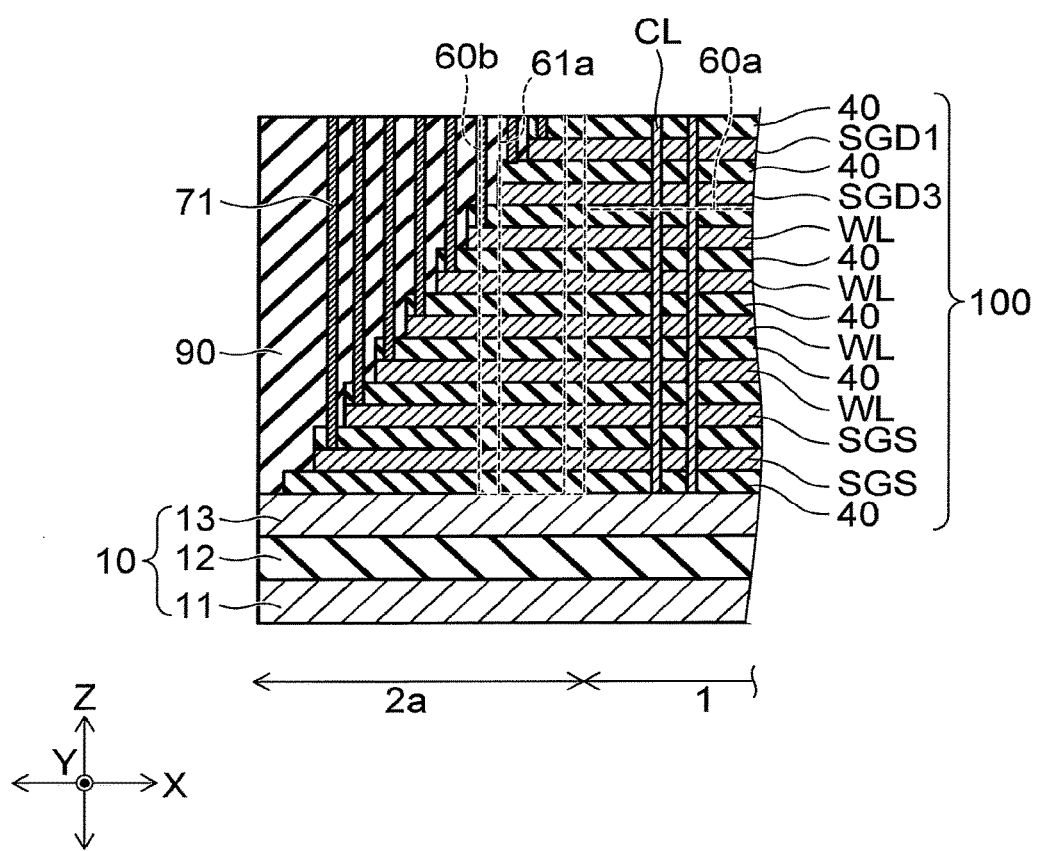
FIG. 17 is a schematic cross-sectional view showing a semiconductor device of a second embodiment.
Figure 18A:
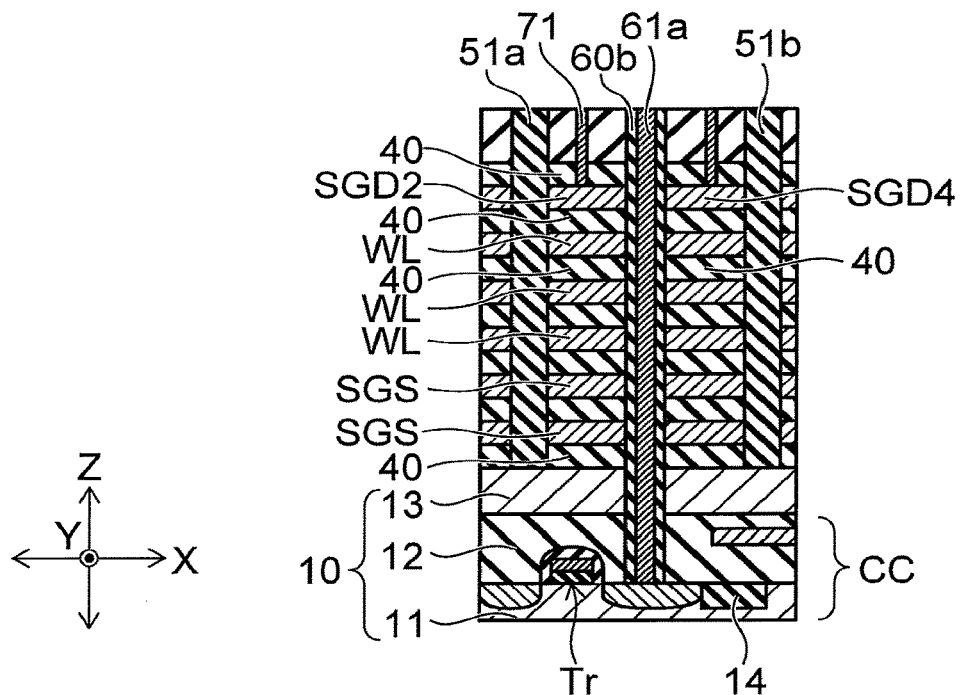
FIG. 18A and FIG. 18B are schematic cross-sectional views showing the semiconductor device of the second embodiment.
Figure 18B:
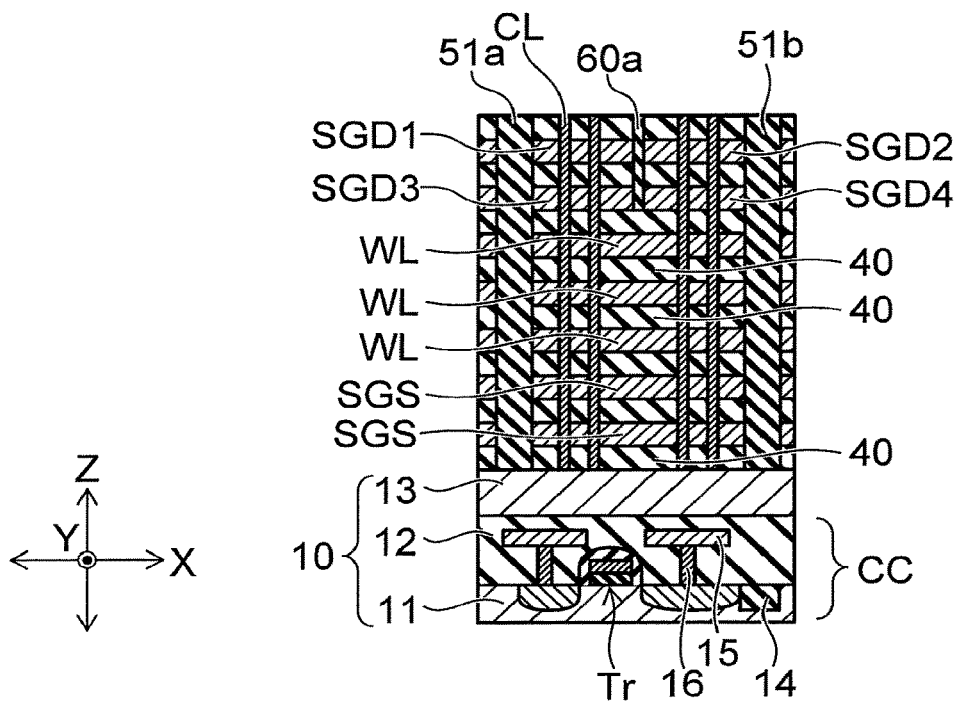

FIG. 17 is a schematic cross-sectional view showing a semiconductor device of a second embodiment. FIG. 18A and FIG. 18B are schematic cross-sectional views showing the semiconductor device of the second embodiment. FIG. 17 corresponds to the cross section along line III-III shown in FIG. 1. FIG. 18A corresponds to the cross section along line IVa-IVa shown in FIG. 1. FIG. 18B corresponds to the cross section along line IVb-IVb shown in FIG. 1.

As shown in FIG. 17 to FIG. 18B, the base material 10 includes a semiconductor substrate 11, an inter-layer insulating film 12, and a semiconductor layer 13.

As shown in FIGS. 18A and 18B, the semiconductor substrate 11 is, for example, a silicon substrate. The inter-layer insulating film 12 is provided between the semiconductor substrate 11 and the stacked body 100. The semiconductor layer 13 is provided between the inter-layer insulating film 12 and the stacked body 100.

As shown in FIG. 18A and FIG. 18B, a peripheral circuit CC is formed inside the inter-layer insulating film 12 and the upper layer portion of the semiconductor substrate 11. The peripheral circuit CC includes, for example, a word line drive circuit and/or a sense amplifier.

For example, STI (Shallow Trench Isolation) 14 is provided in the upper layer portion of the semiconductor substrate 11. For example, the upper layer portion of the semiconductor substrate 11 is divided into multiple active areas by the STI (Shallow Trench Isolation) 14. For example, a transistor Tr is formed in the active area. An interconnect 15 and a via 16 also are provided inside the inter-layer insulating film 12. For example, the via 16 electrically connects the interconnect 15 and the source/drain region of the transistor Tr.

In the staircase portion 2a, the second portion 60b extends in the Z-direction through the stacked body 100, the semiconductor layer 13, and the inter-layer insulating film 12. The conductive portion 61a extends in the Z-direction through the second portion 60b and is electrically connected to, for example, the source/drain region of the transistor Tr.

For example, the columnar portions CL are electrically connected to the peripheral circuit CC via the semiconductor layer 13. For example, the semiconductor layer 13 may be used as a source line. In such a case, the source line LIa and the source line LIb are not provided inside the slit ST1 and the slit ST2. The slit ST1 is filled with the insulating film 51a. The slit ST2 is filled with the insulating film 51b. The potential that is necessary for driving is supplied to the semiconductor layer 13 from the peripheral circuit CC.

Although not illustrated, for example, the third portion 60c extends in the Z-direction through the stacked body 100, the semiconductor layer 13, and the inter-layer insulating film 12 in the staircase portion 2b. The conductive portion 61b extends in the Z-direction through the third portion 60c and is electrically connected to the semiconductor substrate 11. In FIG. 18A and FIG. 18B, the depiction of the transistor Tr, the interconnect 15, and the via 16 is schematic and does not always match the size and arrangement of the actual element.

Thus, according to the embodiment, a semiconductor device can be provided in which the degree of difficulty of the patterning of the stacked body can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a stacked body including
      a first selection gate electrode layer extending along a first direction and including a first end portion,
      a second selection gate electrode layer extending along the first direction, being arranged with the first selection gate electrode layer in a second direction, and including a second end portion, the second direction crossing the first direction,
      a word line extending along the first direction and being arranged in a third direction with the first selection gate electrode layer and the second selection gate electrode layer, the third direction crossing the first direction and the second direction,
      a third selection gate electrode layer extending along the first direction and being provided between the first selection gate electrode layer and the word line, the third selection gate electrode layer including a third end portion, and
      a fourth selection gate electrode layer extending along the first direction, being provided between the second selection gate electrode layer and the word line, and being arranged in the second direction with the third selection gate electrode layer, the fourth selection gate electrode layer including a fourth end portion;
   an insulating portion including
      a first portion overlapping a portion of the word line in the third direction and extending along the first direction between the first selection gate electrode layer and the second selection gate electrode layer and between a portion of the third selection gate electrode layer and a portion of the fourth selection gate electrode layer, and
      a second portion contacting the first portion and extending in the third direction between the third end portion and the fourth end portion and through the word line; and a plurality of columnar portions extending along the third direction through the stacked body and being separated from the insulating portion.

2. The device according to claim 1, wherein
the plurality of columnar portions includes:
   a first columnar portion extending in the third direction through the first selection gate electrode layer, the third selection gate electrode layer, and the word line; and
   a second columnar portion extending in the third direction through the second selection gate electrode layer, the fourth selection gate electrode layer, and the word line,
the first end portion is positioned between the third end portion and the first columnar portion in the first direction, and
the second end portion is positioned between the fourth end portion and the second columnar portion in the first direction.

3. The device according to claim 1, wherein
the third end portion is positioned between the first end portion and a fifth end portion of the word line in the first direction, and
the fourth end portion is positioned between the fifth end portion and the second end portion in the first direction.

4. The device according to claim 1, further comprising a first conductive portion extending along the third direction through the second portion.

5. The device according to claim 4, further comprising a base material,
the word line being disposed between the base material and the third selection gate electrode layer and between the base material and the fourth selection gate electrode layer,
the first conductive portion being electrically connected to the base material.

6. The device according to claim 1, wherein
the columnar portion includes:
   a semiconductor body extending in the third direction; and
   a charge storage portion provided between the semiconductor body and the word line.

7. The device according to claim 1, further comprising a first insulating film extending in the first direction and the third direction through the stacked body,
   the first selection gate electrode layer and the third selection gate electrode layer being disposed between the insulating portion and the first insulating film.

8. The device according to claim 7, further comprising a first interconnect layer extending in the third direction through the first insulating film.

9. The device according to claim 7, wherein a length in the first direction of the first insulating film is longer than a length in the first direction of the insulating portion.

10. The device according to claim 1, further comprising a second insulating film extending in the first direction and the third direction through the stacked body,
   the second selection gate electrode layer and the fourth selection gate electrode layer being disposed between the insulating portion and the second insulating film.

11. The device according to claim 10, further comprising a second interconnect layer extending in the third direction through the second insulating film.

12. The device according to claim 10, wherein a length in the first direction of the second insulating film is longer than a length in the first direction of the insulating portion.

13. The device according to claim 1, wherein
the word line is multiply provided, and
the plurality of word lines is stacked along the third direction with an insulating body interposed.

14. The device according to claim 1, wherein
the insulating portion includes a third portion contacting the first portion,
the third selection gate electrode layer includes a third opposite end portion on a side opposite to the third end portion,
the fourth selection gate electrode layer includes a fourth opposite end portion on a side opposite to the fourth end portion, and
the third portion extends along the third direction between the third opposite end portion and the fourth opposite end portion and through the word line.

15. The device according to claim 14, wherein
the first selection gate electrode layer includes a first opposite end portion on a side opposite to the first end portion,
the second selection gate electrode layer includes a second opposite end portion on a side opposite to the second end portion, and
a portion of the third portion is disposed between the first opposite end portion and the second opposite end portion.

16. The device according to claim 14, further comprising a second conductive portion extending in the third direction through the third portion.

\* \* \* \* \*